United States Patent
Park et al.

(10) Patent No.: US 12,107,555 B2
(45) Date of Patent: Oct. 1, 2024

(54) DRIVE AMPLIFIER

(71) Applicant: ELECTRONICS AND TELECOMMUNICATIONS RESEARCH INSTITUTE, Daejeon (KR)

(72) Inventors: Min Park, Daejeon (KR); Jang Hong Choi, Daejeon (KR); Bon Tae Koo, Daejeon (KR); Kisu Kim, Daejeon (KR); Kyung Hwan Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 671 days.

(21) Appl. No.: 17/317,483

(22) Filed: May 11, 2021

(65) Prior Publication Data
US 2021/0359654 A1    Nov. 18, 2021

(30) Foreign Application Priority Data
May 12, 2020    (KR) .......... 10-2020-0056640

(51) Int. Cl.
H03F 3/24    (2006.01)
H03F 3/217    (2006.01)
H03G 3/30    (2006.01)

(52) U.S. Cl.
CPC .......... *H03F 3/245* (2013.01); *H03F 3/2171* (2013.01); *H03G 3/3042* (2013.01); *H03F 2200/451* (2013.01)

(58) Field of Classification Search
CPC .. H03F 3/245; H03F 3/2171; H03F 2200/451; H03F 3/45475; H03F 1/223; H03F 1/0211; H03F 3/193; H03G 3/3042; H03G 1/0029; H03G 1/0088; H03G 3/3036
USPC .......................................... 330/253
See application file for complete search history.

(56) References Cited

U.S. PATENT DOCUMENTS

| 6,972,624 | B1 | 12/2005 | Stroet |
| 7,521,997 | B2 | 4/2009 | Beck et al. |
| 7,944,311 | B1 | 5/2011 | Jeon et al. |
| 10,840,960 | B1* | 11/2020 | Al-Shyoukh ......... H03F 3/3001 |
| 2006/0132242 | A1 | 6/2006 | Han et al. |
| 2008/0007335 | A1* | 1/2008 | Park .................... H03F 1/22 330/195 |

(Continued)

FOREIGN PATENT DOCUMENTS

| JP | H10-322149 A | 12/1998 |
| JP | 2007-221402 A | 8/2007 |

(Continued)

*Primary Examiner* — Andrea Lindgren Baltzell
*Assistant Examiner* — Jose E Pinero (57) ABSTRACT

Provided is a drive amplifier. A drive amplifier may include: a main circuit configured to receive an RF input signal and output a first RF output signal; and a selective bias adjustment circuit comprising a first common gate transistor to which a first common gate bias voltage is applied and a second common gate transistor to which a second common gate bias voltage is applied, and configured to output a second RF output signal using the first common gate transistor and the second common gate transistor.

19 Claims, 9 Drawing Sheets

(56) References Cited

U.S. PATENT DOCUMENTS

| | | | |
|---|---|---|---|
| 2010/0060363 A1 | 3/2010 | Han et al. | |
| 2011/0063030 A1 | 3/2011 | Jang et al. | |
| 2012/0056678 A1* | 3/2012 | Wang | H03F 1/0266 |
| | | | 330/296 |
| 2013/0314164 A1 | 11/2013 | Din et al. | |
| 2014/0354363 A1 | 12/2014 | Kim et al. | |
| 2016/0277049 A1 | 9/2016 | Kang et al. | |
| 2019/0334488 A1* | 10/2019 | Yoo | H03F 3/195 |
| 2021/0111684 A1 | 4/2021 | Lee | |
| 2023/0223904 A1* | 7/2023 | Ryu | H03F 1/0211 |
| | | | 330/277 |

FOREIGN PATENT DOCUMENTS

| | | |
|---|---|---|
| KR | 10-2005-0057715 A | 6/2005 |
| KR | 10-2006-0044106 A | 5/2006 |
| KR | 10-2006-0070796 A | 6/2006 |
| KR | 10-2007-0109416 A | 11/2007 |
| KR | 10-2011-0069685 A | 6/2011 |
| KR | 20140141090 A | 12/2014 |
| KR | 10-2019-0052020 A | 5/2019 |

\* cited by examiner

DRIVE AMPLIFIER

CROSS-REFERENCE TO RELATED APPLICATION

This application claims priority to and the benefit of Korean Patent Application No. 10-2020-0056640 filed in the Korean Intellectual Property Office on May 12, 2020, the entire contents of which are incorporated herein by reference.

BACKGROUND OF THE DISCLOSURE

(a) Field of the Disclosure

The present disclosure relates to a drive amplifier.

(b) Description of the Related Art

The drive amplifier can be applied to various communication systems. For example, drive amplifiers may be used in a wireless communication system such as a detection radar system capable of detecting moving objects (for example, small unmanned moving objects) in the radio frequency (RF) and microwave bands.

In order to improve the performance of the system to which the drive amplifier is applied and to implement precise control, it is necessary for the drive amplifier to control the magnitude of its transmission power to be varied. For example, in the case of a detection radar system, if the transmission power can be controlled to be varied, a detection area can be appropriately set or adjusted according to a size of a moving object or a detection range. Therefore, there is a need for a method for providing a drive amplifier (or "a drive amplifying device") capable of selectively controlling transmission power.

The above information disclosed in this Background section is only for enhancement of understanding of the background of the disclosure, and therefore it may contain information that does not form the prior art that is already known in this country to a person of ordinary skill in the art.

SUMMARY OF THE DISCLOSURE

The present disclosure has been made in an effort to provide a drive amplifier being capable of selectively controlling transmission power, or a drive amplifier having a cascode structure and being capable of controlling the gain of the drive amplifier by implementing internal bias adjustment through division of common gate.

An example embodiment of the present disclosure provides a drive amplifier including: a main circuit configured to receive an RF input signal and output a first RF output signal; and a selective bias adjustment circuit including a first common gate transistor to which a first common gate bias voltage is applied and a second common gate transistor to which a second common gate bias voltage is applied, and configured to output a second RF output signal using the first common gate transistor and the second common gate transistor.

According to an embodiment of the present disclosure, the first common gate transistor is turned on and the second common gate transistor is turned off.

According to an embodiment of the present disclosure, a channel width of the first common gate transistor is different from a channel width of the second common gate transistor.

According to an embodiment of the present disclosure, the selective bias adjustment circuit further includes a third common gate transistor to which a third common gate bias voltage different from the first common gate bias voltage and the second common gate bias voltage is applied.

According to an embodiment of the present disclosure, the main circuit and the selective bias adjustment circuit are connected in a cascode structure.

According to an embodiment of the present disclosure, the selective bias adjustment circuit includes a first selective bias adjustment circuit and a second selective bias adjustment circuit, and the first selective bias adjustment circuit and the second selective bias adjustment circuit have a differential structure.

According to an embodiment of the present disclosure, the drive amplifier further includes a transmission line transformer (TLT), and wherein the second RF output signal is transferred to a power stage through the TLT.

According to an embodiment of the present disclosure, the drive amplifier further includes an input terminal connected to a driving stage, and wherein the RF input signal is provided from the driving stage through the input terminal.

According to an embodiment of the present disclosure, the drive amplifier further includes an RF output terminal, and wherein the second RF output signal is transmitted to the outside through the RF output terminal.

Another embodiment of the present disclosure provides, a drive amplifier including: an RF input terminal configured to receive an RF input signal; a driving stage configured to variably adjust a gain of an output signal with respect to the RF input signal by using a first selective bias adjustment circuit; a power stage configured to variably adjust a gain of an RF output signal with respect to the output signal provided from the driving stage by using a second selective bias adjustment circuit; and an RF output terminal configured to transmit the RF output signal to the outside.

According to an embodiment of the present disclosure, the first selective bias adjustment circuit includes a plurality of first common gate transistors, and a first common gate bias voltage is applied to a part of the plurality of first common gate transistors, and a second common gate bias voltage different from the first common gate bias voltage is applied to another part of the plurality of first common gate transistors.

According to an embodiment of the present disclosure, the part of the plurality of first common gate transistors are turned on, and the another part of the plurality of first common gate transistors are turned off.

According to an embodiment of the present disclosure, the second selective bias adjustment circuit includes a plurality of second common gate transistors, and a third common gate bias voltage is applied to a part of the plurality of second common gate transistors, and a fourth common gate bias voltage different from the third common gate bias voltage is applied to another part of the plurality of first common gate transistors.

According to an embodiment of the present disclosure, the part of the plurality of second common gate transistors are turned on, and the another part of the plurality of second common gate transistors are turned off.

According to an embodiment of the present disclosure, a channel width of the part of the plurality of second common gate transistors is different from a channel width of the another part of the plurality of second common gate transistors.

Yet another embodiment of the present disclosure provides a drive amplifier including: a first driving stage configured to variably adjust a gain of a first output signal with respect to an RF input signal by using a first selective bias adjustment circuit; a second driving stage configured to variably adjust a gain of a second output signal with respect to the first output signal provided from the first driving stage by using a second selective bias adjustment circuit; and a power stage configured to variably adjust a gain of an RF output signal with respect to the second output signal provided from the second driving stage by using a third selective bias adjustment circuit.

According to an embodiment of the present disclosure, the first selective bias adjustment circuit includes a plurality of first common gate transistors, and a first common gate bias voltage is applied to a part of the plurality of first common gate transistors, and a second common gate bias voltage different from the first common gate bias voltage is applied to another part of the plurality of first common gate transistors.

According to an embodiment of the present disclosure, the second selective bias adjustment circuit includes a plurality of second common gate transistors, and a third common gate bias voltage is applied to a part of the plurality of second common gate transistors, and a fourth common gate bias voltage different from the third common gate bias voltage is applied to another part of the plurality of second common gate transistors.

According to an embodiment of the present disclosure, the third selective bias adjustment circuit includes a plurality of third common gate transistors, and a fifth common gate bias voltage is applied to a part of the plurality of third common gate transistors, and a sixth common gate bias voltage different from the fifth common gate bias voltage is applied to another part of the plurality of third common gate transistors.

According to an embodiment of the present disclosure, a channel width of the part of the plurality of third common gate transistors is different from a channel width of the another part of the plurality of third common gate transistors.

DETAILED DESCRIPTION OF THE EMBODIMENTS

Hereinafter, embodiments of the present disclosure will be described in detail with reference to the accompanying drawings so that those of ordinary skill in the art may easily implement the present disclosure. However, the present disclosure may be implemented in various different ways and is not limited to the embodiments described herein.

In the drawings, parts irrelevant to the description are omitted in order to clearly describe the present disclosure, and like reference numerals are assigned to like elements throughout the specification.

Throughout the specification and claims, unless explicitly described to the contrary, the word "comprise", and variations such as "comprises" or "comprising", will be understood to imply the inclusion of stated elements but not the exclusion of any other elements.

Figure 1:
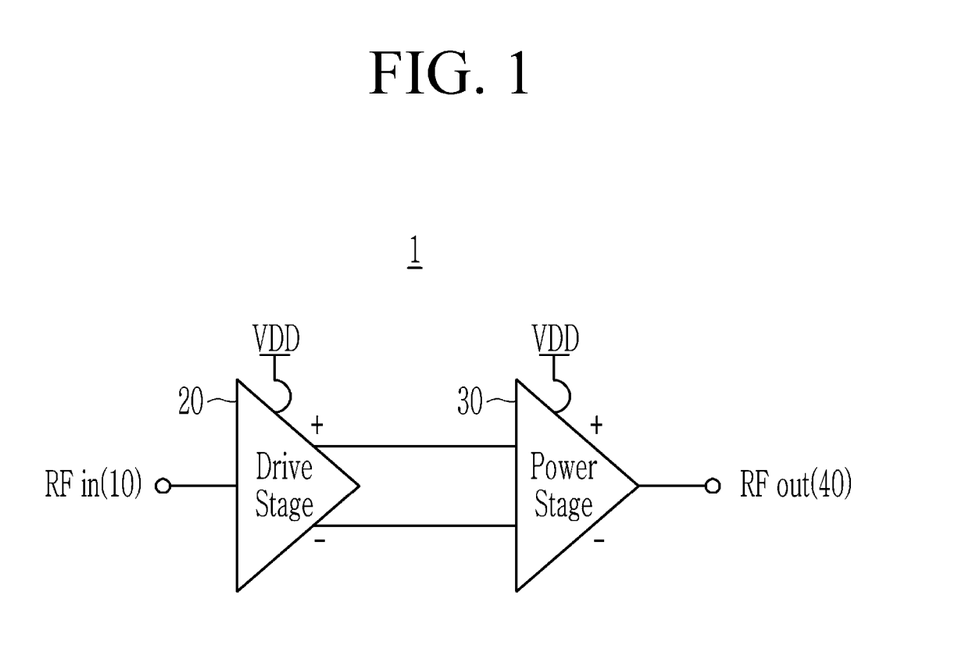
FIG. 1 illustrates a drive amplifier according to an embodiment of the present disclosure.

FIG. 1 illustrates a drive amplifier according to an embodiment of the present disclosure.

Referring to FIG. 1, a drive amplifier 1 according to an embodiment of the present disclosure may include an RF input terminal 10, a driving stage 20, a power stage 30, and an RF output terminal 40. FIG. 1 illustrates a two-stage drive amplifier for convenience of explanation, but the scope of the present disclosure is not limited thereto.

The RF input terminal 10 may receive an RF input signal, and the driving stage 20 may variably adjust a gain of an output signal for the RF input signal by using a first selective bias adjustment circuit. Meanwhile, the power stage 30 may variably adjust a gain of an RF output signal with respect to the output signal provided from the driving stage 20 by using the second selective bias adjustment circuit. And, the RF output terminal 40 may transmit the RF output signal to the outside.

The drive amplifier 1 may have a cascode structure, and control the gain of the drive amplifier 1 by performing an internal bias adjustment through division of common gate in the driving stage 20 or the power stage 30 to selectively drive the output power of the drive amplifier 1. Here, the division of common gate may mean selectively applying common gate bias voltage to the common gate transistor, that is, applying common gate bias voltage to the common gate transistor at various values.

In addition, the drive amplifier 1 may control the gain of the drive amplifier 1 by performing turn on and turn off in units of common gate transistors, that is, in units of cells in the driving stage 20 or the power stage 30 to selectively drive the output power of the drive amplifier 1.

Further, the drive amplifier 1 can obtain desired output characteristics by selectively applying common gate bias voltages to common gate transistors having a different channel width in the driving stage 20 or in the power stage 30.

According to the present embodiment, the drive amplifier 1 may selectively control transmission power and may have an efficient gain without changing a frequency band. In addition, since the desired output characteristics can be obtained by varying the channel width in the power stage 30, there is no need to implement an additional passive element (for example, a switch) to select the output in the desired frequency band, the decrease in efficiency resulting from the resistive component of the passive element can be avoided, thus high efficiency and high gain characteristics can be realized.

In addition, since it is not necessary to increase the size of the TLT for selecting an additional output band of the drive amplifier 1, the gain characteristics and the output characteristics of the drive amplifier 1 can be improved, and the drive amplifier 1 can be manufactured in a small size and integrated with a phase shifter in the transmission module chip of the detection radar system, and manufacturing cost can be saved.

Further details of the drive amplifier 1 will be described later with reference to FIG. 2 to FIG. 8.

Figure 2:
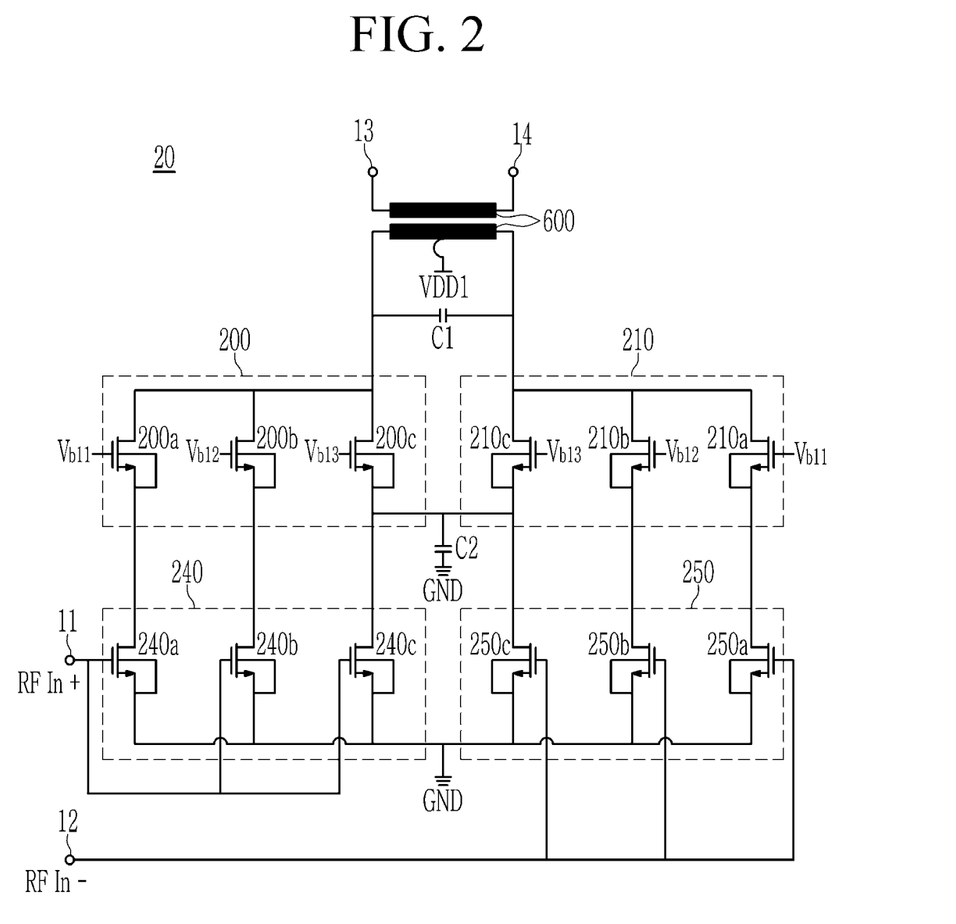
FIG. 2 is a circuit diagram illustrating an example of a driving stage of a drive amplifier according to an embodiment of the present disclosure.

FIG. 2 is a circuit diagram illustrating an example of a driving stage of a drive amplifier according to an embodiment of the present disclosure.

Referring to FIG. 2, the driving stage 20 of the drive amplifier according to an embodiment of the present disclosure may include input terminals 11 and 12, output terminals 13 and 14, selective bias adjustment circuits 200 and 210, main circuits 240 and 250, and a TLT 600.

The input terminals 11 and 12 are terminals for receiving an RF input signal, and the output terminals 13 and 14 are terminals for transmitting an RF output signal processed by the driving stage 20 for the RF input signal. In particular, in this embodiment, the output terminals 13 and 14 may be connected to the input terminals of the power stage 30 in order to provide an output signal output from the driving stage 20 as an input of the power stage 30 to be described later with respect to FIG. 3.

The main circuits 240 and 250 may receive an RF input signal through the input terminals 11 and 12, output the first RF output signal, and provide the first RF output signal to the selective bias adjustment circuits 200 and 210. Meanwhile, the main circuits 240 and 250 may include a first main circuit 240 and a second main circuit 250, and the first main circuit 240 and the second main circuit 250 may have a differential structure.

The selective bias adjustment circuits 200 and 210 may perform selective bias adjustment on the first RF output signal provided from the main circuits 240 and 250, and then output a second RF output signal and provide the second RF output signal to the output terminals 13 and 14 through the TLT 600. Meanwhile, the selective bias adjustment circuits 200 and 210 may include a first selective bias adjustment circuit 200 and a second selective bias adjustment circuit 210, and the first selective bias adjustment circuit 200 and the second selective bias adjustment circuit 210 may have a differential structure.

The selective bias adjustment circuits 200 and 210 may include a plurality of common gate transistors 200a-200c and 210a-210c. Here, a first common gate bias voltage may be applied to the first common gate transistor (for example, common gate transistor 200a) among the plurality of common gate transistors 200a-200c and 210a-210c, and a second common gate bias voltage different from the first common gate bias voltage may be applied to the second common gate transistor (for example, common gate transistor 200b) among the plurality of common gate transistors 200a-200c and 210a-210c.

Also, a third common gate bias voltage different from the first common gate bias voltage and the second common gate bias voltage may be applied to the third common gate transistor (for example, common gate transistor 200c) among the plurality of common gate transistors 200a-200c and 210a-210c.

Here, the first common gate bias voltage to the third common gate bias voltage may have any voltage as long as the voltage within a range in which the plurality of common gate transistors 200a-200c and 210a-210c can operate, but in particular, it may generally mean a voltage greater than or equal to a threshold voltage.

Meanwhile, the first common gate transistor (for example, common gate transistor 200a) among the plurality of common gate transistors 200a-200c and 210a-210c may be turned on, the second common gate transistor (for example, common gate transistor 200b) among the plurality of common gate transistors 200a-200c and 210a-210c may be turned off. For example, by applying a first common gate bias voltage having a voltage value greater than or equal to a threshold voltage to the first common gate transistor, and applying a second common gate bias voltage having a voltage value less than the threshold voltage to the second common gate transistor, only the second common gate transistor can be selectively turned off.

The selective bias adjustment circuits 200 and 210 may use a plurality of common gate transistors 200a-200c and 210a-210c to which different common gate bias voltages are applied as described above, in order to output a second RF output signal implementing various gains according to an application purpose.

For example, when the operating voltage of the common gate transistor is 1.2 V, if the common gate bias voltage $V_{b13}$ applied to the common gate transistor 200c is determined to be 0 V, and the common gate bias voltages $V_{b11}$ and $V_{b12}$ applied to the common gate transistors 200a and 200b are respectively determined to be 1.2 V in the selective bias adjustment circuit 200, then only the common gate transistors 200a and 200b operate. Accordingly, among the RF input signals, only the RF signals that have passed through the transistors 240a and 240b of the main circuit 240 may be transmitted to the power stage 30. In this case, compared to the case where the common gate transistors 200a to 200c are all turned on, the gain of the driving stage 20 becomes smaller, and accordingly, the RF signal passing through the power stage 30 may also be lowered by gain control. Thus, in this manner, the drive amplifier 1 can be implemented to meet the requirements of a specific application field or a gain change characteristic.

Of course, the common gate bias voltage may not be determined only as a value within a range for turning on or turning off the transistor. That is, according to a specific application field or a requirement of a gain change characteristic, the common gate bias voltage may be determined as a bias voltage having different voltage values while turning on all transistors.

Meanwhile, in this embodiment, the main circuits 240 and 250 and the selective bias adjustment circuits 200 and 210 may be connected in a cascode structure. That is, as shown in FIG. 2, the main circuits 240 and 250 may be implemented in the form of a common source amplifier, and the selective bias adjustment circuits 200 and 210 may be implemented in the form of a common gate amplifier, but the scope of the present disclosure is not limited thereto.

The TLT 600 is for impedance matching for the output of the driving stage 20. For example, the TLT 600 may perform inter-stage impedance matching between the driving stage 20 and the power stage 30 to be described later with reference to FIG. 3. In this case, in order to ensure stability and reliability of the device during impedance matching, the driving stage 20 may further include capacitors C1 and C2.

The second RF output signal output from the selective bias adjustment circuits 200 and 210 may be transmitted to the power stage 30 through the TLT 600.

Figure 3:
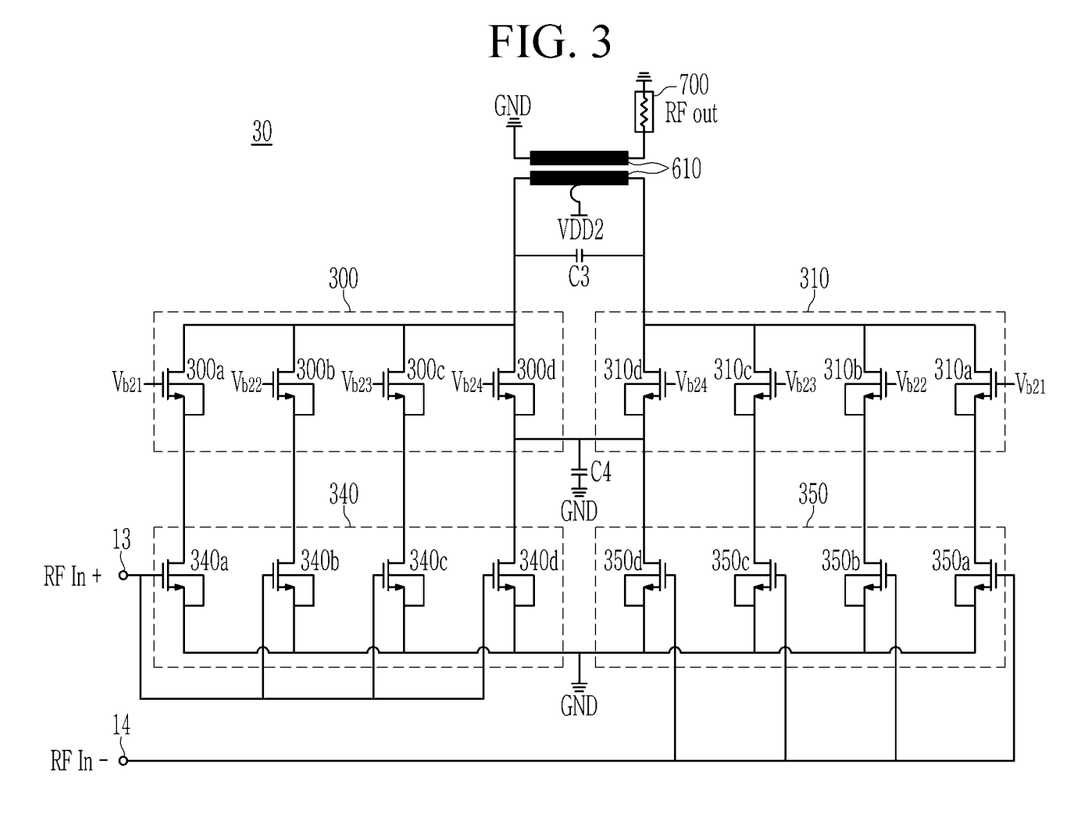
FIG. 3 and FIG. 4 are circuit diagrams illustrating an example of a power stage of a drive amplifier according to an embodiment of the present disclosure.
Figure 4:
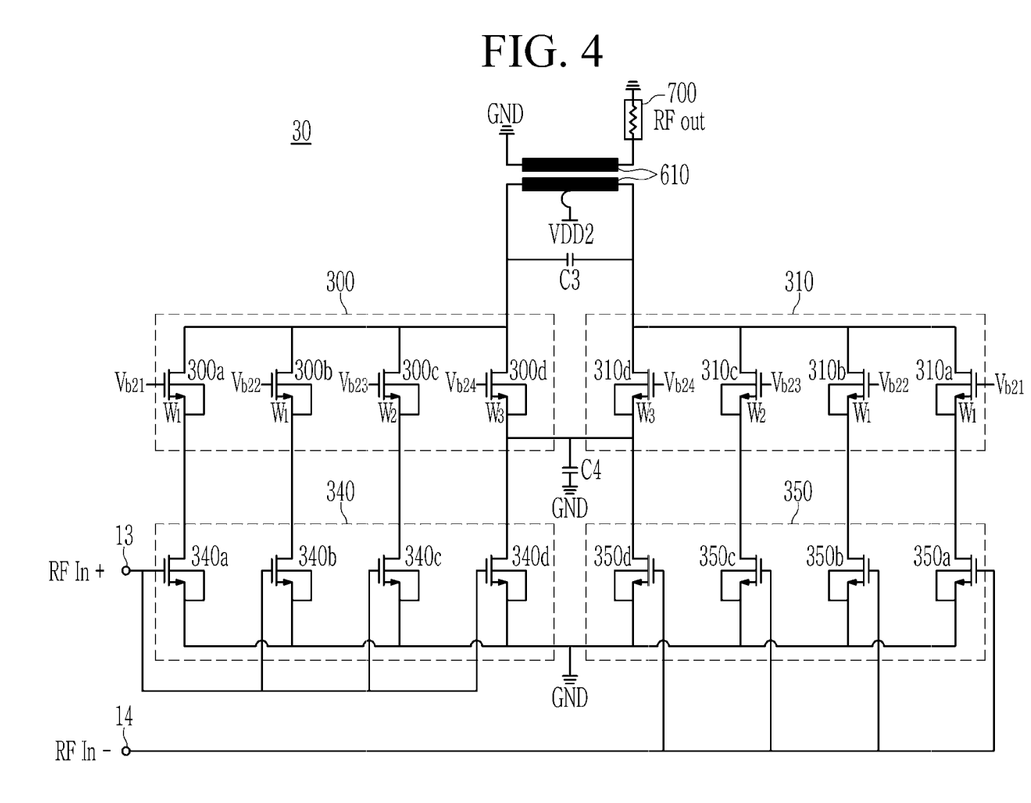

FIG. 3 and FIG. 4 are circuit diagrams illustrating an example of a power stage of a drive amplifier according to an embodiment of the present disclosure.

Referring to FIG. 3, the power stage 30 of the drive amplifier according to an embodiment of the present disclosure may include input terminals 13 and 14, an output terminal 700, selective bias adjustment circuits 300 and 310, main circuits 340 and 350, and a TLT 610.

The input terminals 13 and 14 are terminals for receiving an RF input signal, and the output terminal 700 is a terminal for transmitting an RF output signal processed by the power stage 30 on the RF input signal. In particular, in this embodiment, the input terminals 13 and 14 may be connected to the output terminals of the driving state 20 in order to provide an output signal output from the driving stage 20 to be described later with respect to FIG. 2 to the power stage 30. Meanwhile, the output terminal 700 may transmit an RF output signal processed by the power stage 30 to the outside.

The main circuits 340 and 350 may receive an RF input signal through the input terminals 13 and 14, output the first RF output signal, and provide the first RF output signal to the selective bias adjustment circuits 300 and 310. Meanwhile, the main circuits 340 and 350 may include a first main circuit 340 and a second main circuit 350, and the first main circuit 340 and the second main circuit 350 may have a differential structure.

In particular, the sizes of the transistors 340a-340d and 350a-350d constituting the main circuits 340 and 350 may be all the same, or may not be all the same. Here, the size of the transistor may mean the channel width or length of the transistor. That is, the channel widths of all the transistors 340a-340d and 350a-350d may be the same, or, alternatively, for example, the channel width of the transistor 340a and the channel width of the transistor 340b can be different.

The selective bias adjustment circuits 300 and 310 may perform selective bias adjustment on the first RF output signal provided from the main circuits 340 and 350, and then output a second RF output signal and provide the second RF output to the output terminal 700 through the TLT 610. Meanwhile, the selective bias adjustment circuits 300 and 310 may include a first selective bias adjustment circuit 300 and a second selective bias adjustment circuit 310, and a first selective bias adjustment circuit 300 and a second selective bias adjustment circuit 310 may have a differential structure.

The selective bias adjustment circuits 300 and 310 may include a plurality of common gate transistors 300a-300d and 310a-310d. Here, a first common gate bias voltage may be applied to a first common gate transistor (for example, the common gate transistor 300a) among the plurality of common gate transistors 300a-300d and 310a-310d, and a second common gate bias voltage different from the first common gate bias voltage may be applied to the second common gate transistor (for example, common gate transistor 300b) among the plurality of common gate transistors 300a-300d and 310a-310d.

Here, the first common gate bias voltage to the second common gate bias voltage may have any voltage as long as the voltage within a range in which the plurality of common gate transistors 300a-300d and 310a-310d can operate, but in particular, it may generally mean a voltage greater than or equal to a threshold voltage.

Meanwhile, the first common gate transistor (for example, common gate transistor 300a) among the plurality of common gate transistors 300a-300d and 310a-310d may be turned on, the second common gate transistor (for example, common gate transistor 300b) among the plurality of common gate transistors 300a-300d and 310a-310d may be turned off. For example, by applying a first common gate bias voltage having a voltage value greater than or equal to a threshold voltage to the first common gate transistor, and applying a second common gate bias voltage having a voltage value less than the threshold voltage to the second common gate transistor, only the second common gate transistor can be selectively turned off.

In particular, the sizes of the common gate transistors 300a-300d and 310a-310d may be all the same, or all may not be all the same. That is, the channel widths of all the common gate transistors 300a-300d and 310a-310d may be the same, or, alternatively, for example, the channel width of the common gate transistor 300a and the channel width of the common gate transistor 300b can be different.

The selective bias adjustment circuits 300 and 310 and the main circuits 340 and 350 may use a plurality of common gate transistors 300a-300d and 310a-310d to which different common gate bias voltages are applied as described above and which may have different channel widths, in order to output a second RF output signal implementing various gains according to an application purpose.

For example, referring to FIG. 4 together, in the case of determining a relatively low output level, such as ~15.0 dBm, as an application purpose, the channel width W1 of the common gate transistors 300a-300b among the common gate transistors 300a-300d may be implemented as 480 μm, the channel width $W_2$ of the common gate transistor 300c among the common gate transistors 300a-300d may be implemented as 384 μm, and the channel width W3 of the common gate transistor 300d among the common gate transistors 300a-300d may be implemented as 96 μm. Accordingly, it is possible to select a wider range of outputs and obtain the characteristics of a desired output band.

In the case of applying the optimal conditions at the output for application of an X-band radar system ~15.0 dBm, the operating voltage of the common gate transistor is 2.5 V, and if the common gate bias voltages $V_{b21}$ and $V_{b24}$ applied to the common gate transistors 300a and 300d are respectively determined to be 0 V, and the common gate bias voltages $V_{b22}$ and $V_{b23}$ applied to the common gate transistors 300b and 300c are respectively determined to be 2.5 V, then only the common gate transistors 300b and 300c operate. Accordingly, among the RF input signals, only the RF signals that have passed through the transistors 340b and 340c of the main circuit 340 may be transmitted to the RF output terminal 700. In this case, compared to the case where the common gate transistors 300a to 300d are all turned on, when the input signal is 0 dBm, the output of the power stage 30 can be reduced by about 21% from 16.3 dBm to 12.8 dBm. Thus, in this manner, the drive amplifier 1 can be implemented to meet the requirements of a specific application field or a gain change characteristic.

Of course, the common gate bias voltage may not be determined only as a value within a range for turning on or turning off the transistor. That is, according to a specific application field or a requirement of a gain change characteristic, the common gate bias voltage may be determined as a bias voltage having different voltage values while turning on all transistors.

Meanwhile, in this embodiment, the main circuits 340 and 350 and the selective bias adjustment circuits 300 and 310 may be connected in a cascode structure. That is, as shown in FIG. 3, the main circuits 340 and 350 may be implemented in the form of a common source amplifier, and the selective bias adjustment circuits 300 and 310 may be implemented in the form of a common gate amplifier, but the scope of the present disclosure is not limited thereto.

The TLT 610 is for impedance matching for the output of the power stage 30. The TLT 610 may have a wider frequency bandwidth than the TLT 600 performing interstage impedance matching of FIG. 2. In this case, in order to ensure stability and reliability of the device during impedance matching, the power stage 30 may further include capacitors C3 and C4. The second RF output signal output from the selective bias adjustment circuits 300 and 310 may be transmitted to the outside through the TLT 610 and the RF output terminal 700.

Figure 5:
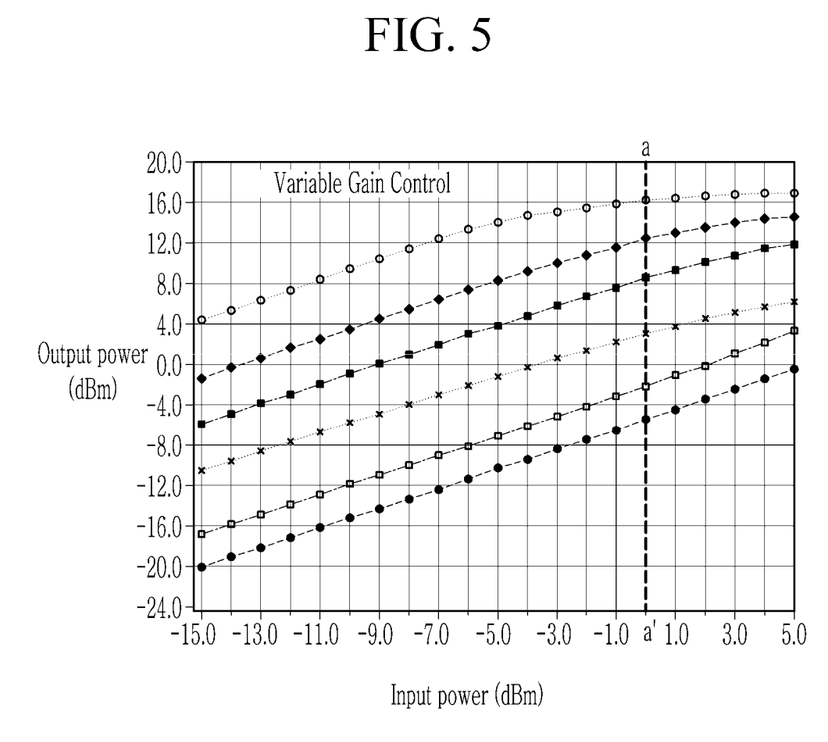
FIG. 5 is a graph illustrating a change in output power versus a change in input power as a result of a simulation for a drive amplifier according to an embodiment of the present disclosure.

FIG. 5 is a graph illustrating a change in output power versus a change in input power as a result of a simulation for a drive amplifier according to an embodiment of the present disclosure.

FIG. 5 illustrates a simulation result of a change in an output power Pout to a change in an input power Pin of a selective drive amplifier having a variable gain value as described above. In the selective drive amplifier having variable gain values, since power elements having different sizes in a cascode structure are used in the power stage, various output values from −5.3 dBm to −1.9 dBm, 3.5 dBm, 8.9 dBm, 12.8 dBm, and 16.3 dBm at the input power Pin=0 indicated by the a-a' line can be obtained by adjusting the bias circuit driving them properly.

Figure 6:
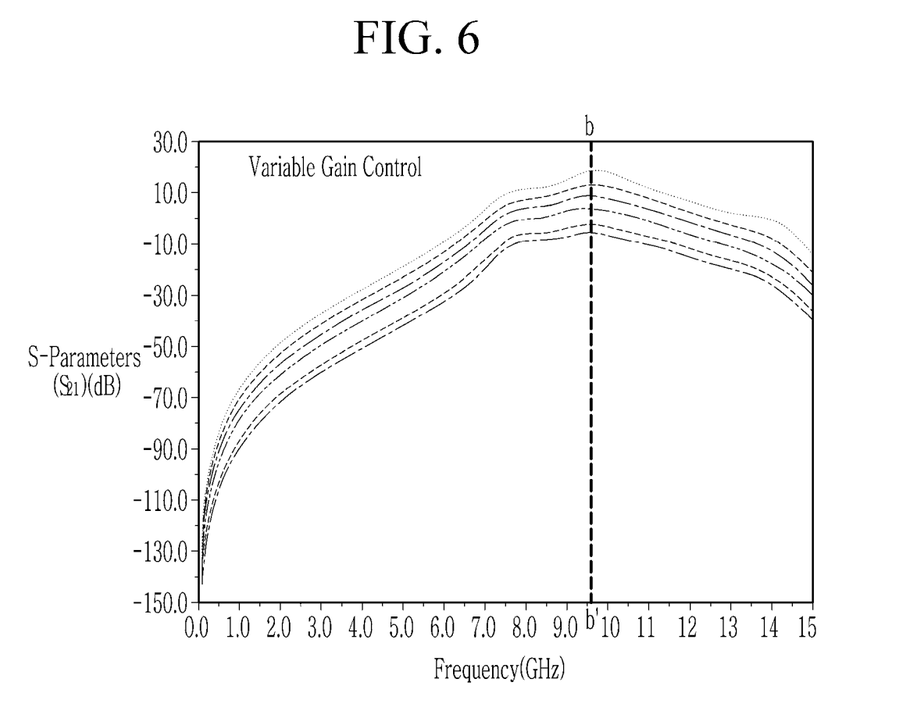
FIG. 6 is a graph illustrating a change in a gain characteristic with respect to a change in a frequency as a result of a simulation for a drive amplifier according to an embodiment of the present disclosure.

FIG. 6 is a graph illustrating a change in a gain characteristic with respect to a change in a frequency as a result of a simulation for a drive amplifier according to an embodiment of the present disclosure.

FIG. 6 illustrates a simulation result of a change in a gain $S_{21}$ characteristic with respect to a frequency change of the selective drive amplifier having variable gain values as described above. When applied to an X-band radar system, the values of the gain S21 according to the change of the common gate bias voltage at the center frequency of 9.6 GHz of the X-band radar system indicated by the b-'b' line are −5.03 dB, −1.73 dB, 4.84 dB, 9.38 dB, 13.96 dB and 19.21 dB.

Figure 7:
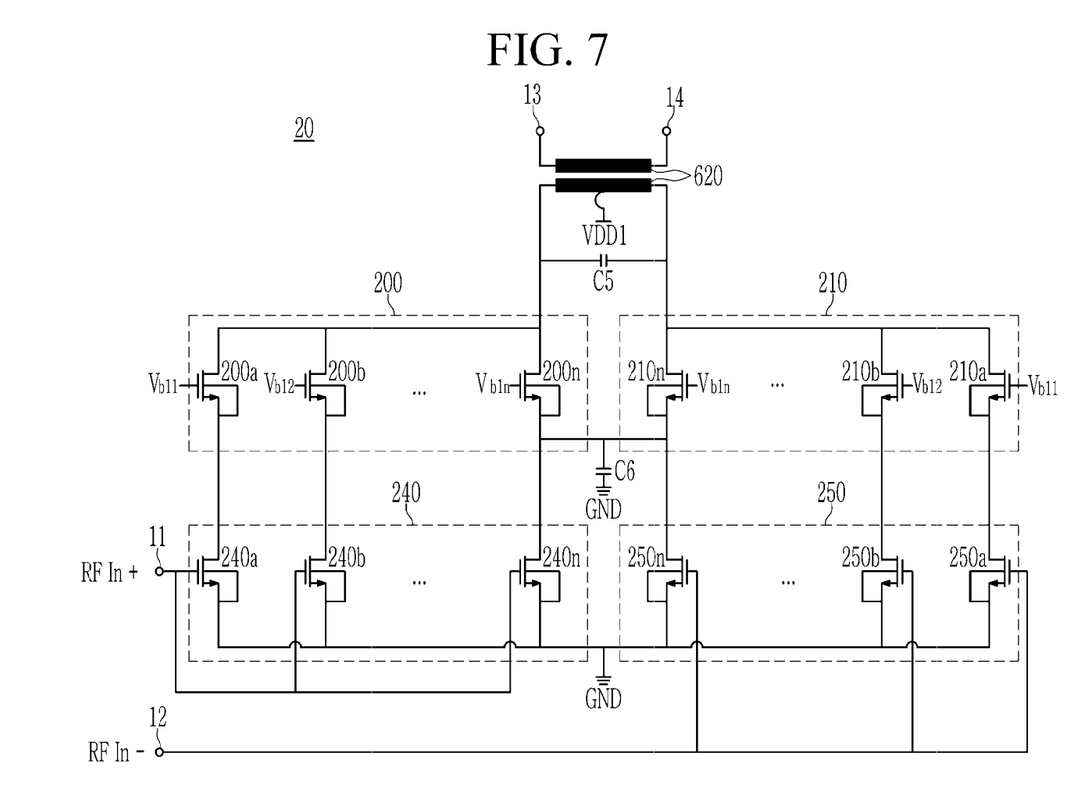
FIG. 7 is a circuit diagram illustrating an example of a driving stage of a drive amplifier according to an embodiment of the present disclosure.

FIG. 7 is a circuit diagram illustrating an example of a driving stage of a drive amplifier according to an embodiment of the present disclosure.

Referring to FIG. 7, the driving stage 20 of the drive amplifier according to an embodiment of the present disclosure may include a first selective bias adjustment circuit 200 including input terminals 11 and 12, output terminals 13 and 14, and n common gate transistors 200a-200n, a second selective bias adjustment circuit 210 including n common gate transistors 210a-210n, a first main circuit 240 including n transistors 240a-240n, a second main circuit 250 including n transistors 250a-250n, and a TLT 620, where n is an integer greater than or equal to 1.

For the input terminals 11 and 12, the output terminals 13 and 14, and the TLT 620, aforementioned explanations for the input terminals 11 and 12, the output terminals 13 and 14, and the TLT 600 can be referred to, so the redundant description thereof will be omitted here.

The n transistors 240a-240n of the first main circuit 240 and the n transistors 250a-250n of the second main circuit 250 may be connected in a cascode structure with n common gate transistors 200a-200n of the first selective bias adjustment circuit 200 and n common gate transistors 210a-210n of the second selective bias adjustment circuit 210.

In addition, the first main circuit 240 and the first selective bias adjustment circuit 200, and the second main circuit 250 and the second selective bias adjustment circuit 210 may have differential structures.

Each of the n common gate transistors 200a-200n of the first selective bias adjustment circuit 200 may be gated by bias voltages $V_{b11}$-$V_{b1n}$, respectively. In addition, the n common gate transistors 210a-210n of the second selective bias adjustment circuit 210 may be gated by bias voltages $V_{b11}$-$V_{b1n}$, respectively.

Here, the bias voltages $V_{b11}$-$V_{b1n}$ may be all the same, or some of the bias voltages $V_{b11}$-$V_{b1n}$ may be different from other bias voltages. Here, the bias voltage $V_{b11}$-$V_{b1n}$ may have an any voltage value capable of turning off the common gate transistors 200a-200n and 210a-210n respectively, or may have an any voltage value capable of turning on the common gate transistors 200a-200n and 210a-210n.

The selective bias adjustment circuits 200 and 210 may use a plurality of common gate transistors 200a-200n and 210a-210n to which different common gate bias voltages are applied as described above, in order to output a second RF output signal implementing various gains according to an application purpose.

Figure 8:
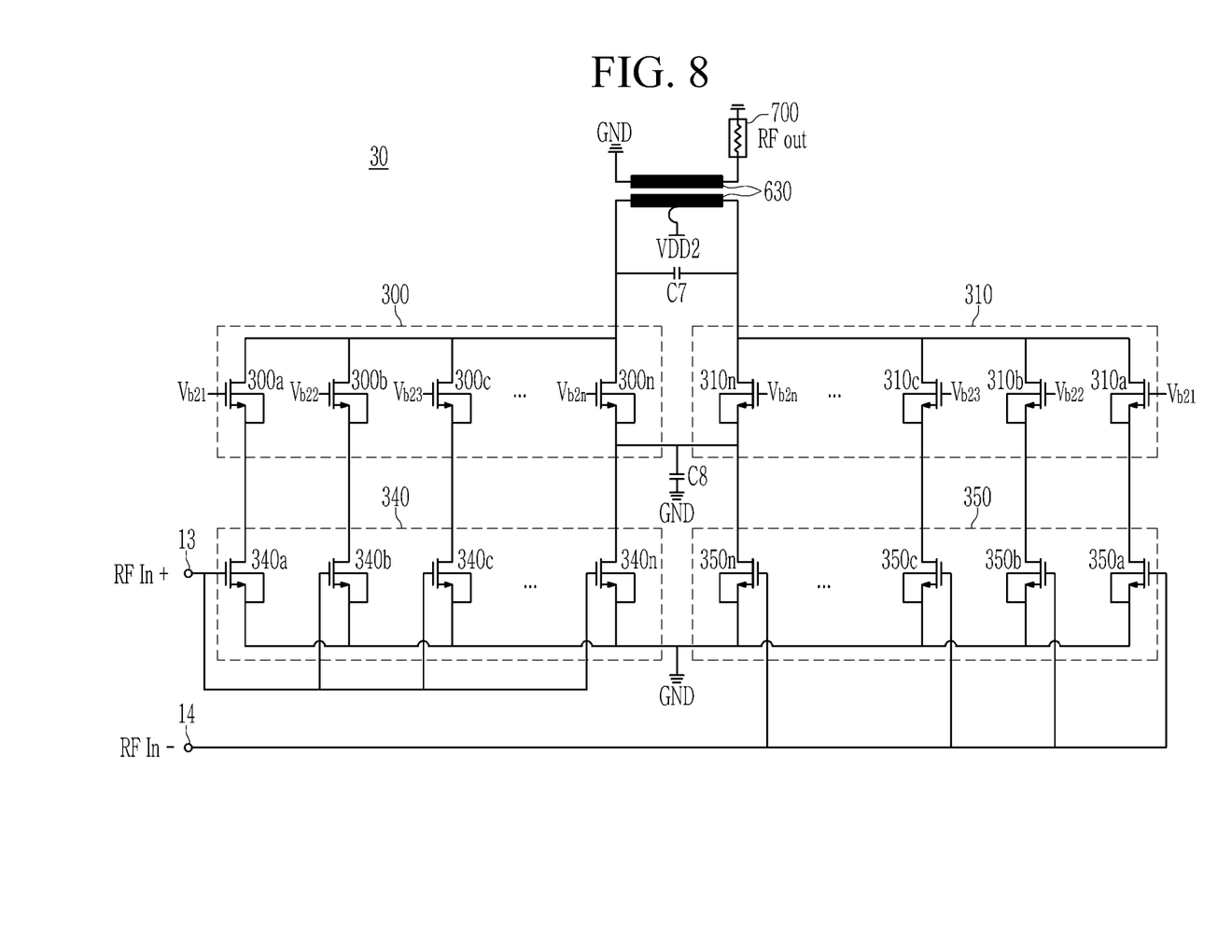
FIG. 8 is a circuit diagram illustrating an example of a power stage of a drive amplifier according to an embodiment of the present disclosure.

FIG. 8 is a circuit diagram illustrating an example of a power stage of a drive amplifier according to an embodiment of the present disclosure.

Referring to FIG. 8, the power stage 30 of the drive amplifier according to an embodiment of the present disclosure may include a first selective bias adjustment circuit 300 including input terminals 13 and 14, an output terminal 700, and n common gate transistors 300a-300n, a second selective bias adjustment circuit 310 including n common gate transistors 310a-310n, a first main circuit 340 including n transistors 340a-340n, a second main circuit 350 including n transistors 350a-350n, and a TLT 630, where n is an integer greater than or equal to 1.

For the input terminals 13 and 14, the output terminal 700, and the TLT 620, aforementioned explanations for the input terminals 13 and 14, the output terminal 700, and the TLT 610 can be referred to, so the redundant description thereof will be omitted here.

The n transistors 340a-340n of the first main circuit 340 and the n transistors 350a-350n of the second main circuit 350 may be connected in a cascode structure with n common gate transistors 300a-300n of the first selective bias adjustment circuit 300 and n common gate transistors 310a-310n of the second selective bias adjustment circuit 310.

In addition, the first main circuit 340 and the first selective bias adjustment circuit 300, and the second main circuit 350 and the second selective bias adjustment circuit 310 may have differential structures.

Each of the n common gate transistors 300a-300n of the first selective bias adjustment circuit 300 may be gated by bias voltages $V_{b21}$-$V_{b2n}$, respectively. In addition, n common gate transistors 310a-310n of the second selective bias adjustment circuit 310 may be gated by bias voltages $V_{b21}$-$V_{b2n}$, respectively.

Here, the bias voltages $V_{b21}$-$V_{b2n}$ may be all the same, or some of the bias voltages $V_{b21}$-$V_{b2n}$ may be different from other bias voltages. Here, the bias voltage $V_{b21}$-$V_{b2n}$ may have an any voltage value capable of turning off the common gate transistors 300a-300n and 310a-310n respectively, or may have an any voltage value capable of turning on the common gate transistors 300a-300n and 310a-310n.

In particular, the sizes of the common gate transistors 300a-300n and 310a-310n may be all the same, or may not be all the same. That is, the channel widths of all the common gate transistors 300a-300n and 310a-310n may be the same, or, alternatively, for example, the channel width of the common gate transistor 300a and the channel width of the common gate transistor 300b can be different.

The selective bias adjustment circuits 300 and 310 may use a plurality of common gate transistors 300a-300n and 310a-310n to which different common gate bias voltages are applied as described above, in order to output a second RF output signal implementing various gains according to an application purpose.

Figure 9:
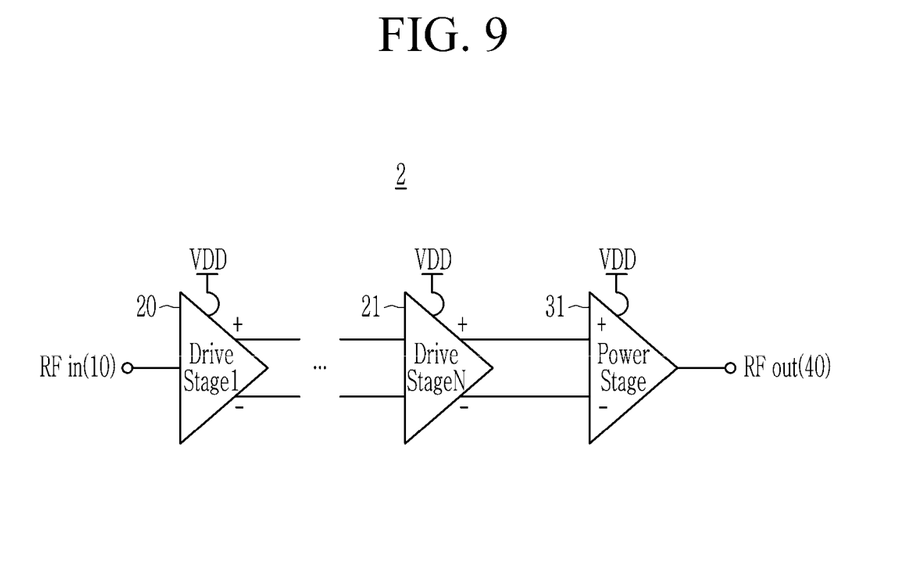
FIG. 9 is a diagram illustrating a drive amplifier according to an embodiment of the present disclosure.

FIG. 9 is a diagram illustrating a drive amplifier according to an embodiment of the present disclosure.

Referring to FIG. 9, a drive amplifier 2 according to an embodiment of the present disclosure may include a first driving stage 20, a second driving stage 21, and a power stage 31. That is, the drive amplifier 2 may include N driving stages (N is an integer greater than or equal to 1).

The first driving stage 20 may variably adjust a gain of a first output signal relative to the RF input signal by using a first selective bias adjustment circuit. Here, the first selective bias adjustment circuit may be implemented in the form of the selective bias adjustment circuit described above with respect to FIG. 2.

That is, the first selective bias adjustment circuit may include a plurality of first common gate transistors, a first common gate bias voltage may be applied to a part of the plurality of first common gate transistors, and a second common gate bias voltage different from the first common gate bias voltage may be applied to another part of the plurality of first common gate transistors.

The second driving stage 21 may variably adjust a gain of the second output signal with respect to the first output signal provided from the first driving stage 20 by using a second selective bias adjustment circuit. Here, the second selective bias adjustment circuit may be implemented in the form of the selective bias adjustment circuit described above with respect to FIG. 2.

That is, the second selective bias adjustment circuit may include a plurality of second common gate transistors, a third common gate bias voltage may be applied to a part of the plurality of second common gate transistors, and a fourth common gate bias voltage different from the third common gate bias voltage may be applied to another part of the plurality of second common gate transistors.

Meanwhile, the power stage 31 may variably adjust a gain of an RF output signal with respect to the second output signal provided from the second driving stage 21 by using the third selective bias adjustment circuit. Here, the third selective bias adjustment circuit may be implemented in the form of the selective bias adjustment circuit described above with respect to FIG. 3 and FIG. 4.

That is, the third selective bias adjustment circuit may include a plurality of third common gate transistors, a fifth common gate bias voltage may be applied to a part of the plurality of third common gate transistors, and a sixth common gate bias voltage different from the fifth common gate bias voltage may be applied to another part of the plurality of third common gate transistors.

Also, a channel width of the part of the plurality of third common gate transistors may be different from a channel width of the another part of the plurality of third common gate transistors.

According to the embodiments of the present disclosure described so far, the drive amplifier may selectively control transmission power and may have an efficient gain without changing a frequency band. In addition, since the desired output characteristics can be obtained by varying the channel width in the power stage, there is no need to implement an additional passive element (for example, a switch) to select the output in the desired frequency band, the decrease in efficiency resulting from the resistive component of the passive element can be avoided, thus high efficiency and high gain characteristics can be realized.

In addition, according to embodiments of the present disclosure, since it is not necessary to increase the size of the TLT for selecting an additional output band of the drive amplifier, the gain characteristics and the output characteristics of the drive amplifier can be improved, and the drive amplifier can be manufactured in a small size and integrated with a phase shifter in the transmission module chip of the detection radar system, and manufacturing cost can be saved.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

What is claimed is:

1. A drive amplifier, comprising:
    a main circuit configured to receive an RF input signal and output a first RF output signal; and
    a selective bias adjustment circuit for determining a gain of the drive amplifier and comprising a first common gate transistor to which a first common gate bias voltage is applied and a second common gate transistor configured in parallel with the first common gate transistor and to which a second common gate bias voltage is applied, and configured to output a second RF output signal using the first common gate transistor and the second common gate transistor.

2. The drive amplifier of claim 1, wherein the gain of the drive amplifier is determined according to:
    whether the first common gate transistor is turned on or off by the first common gate bias voltage, and
    whether the second common gate transistor is turned on or off by the second common gate bias voltage.

3. The drive amplifier of claim 1, wherein:
    a channel width of the first common gate transistor is different from a channel width of the second common gate transistor.

4. The drive amplifier of claim 1, wherein:
    the selective bias adjustment circuit further comprises a third common gate transistor configured in parallel with the first and second common gate transistors and to which a third common gate bias voltage different from the first common gate bias voltage and the second common gate bias voltage is applied.

5. The drive amplifier of claim 1, wherein:
    the main circuit comprises:
        a first input transistor configured to receive the RF input signal, and
        a second input transistor configured in parallel with the first input transistor and configured to receive the RF input signal,
    wherein the first input transistor and the first common gate transistor are connected in a first cascode structure, and the second input transistor and the second common gate transistor are connected in a second cascode structure.

6. The drive amplifier of claim 1, wherein:
    the selective bias adjustment circuit comprises a first selective bias adjustment circuit and a second selective bias adjustment circuit, and the first selective bias adjustment circuit and the second selective bias adjustment circuit have a differential structure.

7. The drive amplifier of claim 1, further comprising:
a transmission line transformer (TLT), and
wherein the second RF output signal is transferred to a power stage through the TLT.

8. The drive amplifier of claim 1, further comprising:
an input terminal connected to a driving stage, and
wherein the RF input signal is provided from the driving stage through the input terminal.

9. A drive amplifier, comprising:
an RF input terminal configured to receive an RF input signal;
a driving stage configured to variably adjust a gain of an output signal with respect to the RF input signal by using a first selective bias adjustment circuit comprising a first plurality of common gate transistors;
a power stage configured to variably adjust a gain of an RF output signal with respect to the output signal provided from the driving stage by using a second selective bias adjustment circuit comprising a second plurality of common gate transistors; and
an RF output terminal configured to transmit the RF output signal to the outside.

10. The drive amplifier of claim 9, wherein:
a first common gate bias voltage is applied to a first common gate transistor of the first plurality of common gate transistors,
a second common gate bias voltage different from the first common gate bias voltage is applied to a second common gate transistor of the first plurality of common gate transistors, and
the gain of the output signal with respect to the RF input signal is determined according to the first common gate bias voltage and the second common gate bias voltage.

11. The drive amplifier of claim 10, wherein the gain of the output signal with respect to the RF input signal is determined according to:
whether the first common gate transistor is turned on or off by the first common gate bias voltage, and
whether the second common gate transistor is turned on or off by the second common gate bias voltage.

12. The drive amplifier of claim 9, wherein:
a third common gate bias voltage is applied to a third common gate transistor of the second plurality of common gate transistors,
a fourth common gate bias voltage different from the third common gate bias voltage is applied a fourth common gate transistor of the second plurality of common gate transistors, and
the gain of an RF output signal with respect to the output signal provided from the driving stage is determined according to the third common gate bias voltage and the fourth common gate bias voltage.

13. The drive amplifier of claim 12, wherein the gain of an RF output signal with respect to the output signal provided from the driving stage is determined according to:
whether the third common gate transistor is turned on or off by the third common gate bias voltage, and
whether the fourth common gate transistor is turned on or off by the fourth common gate bias voltage.

14. The drive amplifier of claim 12, wherein:
a channel width of the third common gate transistor is different from a channel width of the fourth common gate transistor.

15. A drive amplifier, comprising:
a first driving stage configured to variably adjust a gain of a first output signal with respect to an RF input signal by using a first selective bias adjustment circuit comprising a first plurality of common gate transistors;
a second driving stage configured to variably adjust a gain of a second output signal with respect to the first output signal provided from the first driving stage by using a second selective bias adjustment circuit comprising a second plurality of common gate transistors; and
a power stage configured to variably adjust a gain of an RF output signal with respect to the second output signal provided from the second driving stage by using a third selective bias adjustment circuit comprising a third plurality of common gate transistors.

16. The drive amplifier of claim 15, wherein the gain of the first output signal with respect to the RF input signal is adjusted according to:
a first common gate bias voltage that is applied to a first common gate transistor of the first plurality of common gate transistors, and
a second common gate bias voltage that is applied to a second common gate transistor of the first plurality of common gate transistors,
wherein the second common gate bias voltage is different from the first common gate bias voltage.

17. The drive amplifier of claim 15, wherein the gain of a second output signal with respect to the first output signal is adjusted according to:
a third common gate bias voltage that is applied to a third common gate transistor of the second plurality of common gate transistors, and
a fourth common gate bias voltage that is applied to a fourth common gate transistor of the second plurality of common gate transistors,
wherein the fourth common gate bias voltage is different from the third common gate bias voltage.

18. The drive amplifier of claim 15, wherein the gain of an RF output signal with respect to the second output signal is adjusted according to:
a fifth common gate bias voltage that is applied to a fifth common gate transistor of the third plurality of common gate transistors, and
a sixth common gate bias voltage that is applied to a sixth common gate transistor of the third plurality of common gate transistors,
wherein the sixth common gate bias voltage is different from the fifth common gate bias voltage.

19. The drive amplifier of claim 18, wherein:
a channel width of the fifth common gate transistor is different from a channel width of the sixth common gate transistor.

* * * * *